United States Patent [19]

Anzai

[11] Patent Number: 5,184,090
[45] Date of Patent: Feb. 2, 1993

[54] HEAD AMPLIFIER

[75] Inventor: Fukuji Anzai, Moriguchi, Japan

[73] Assignee: Sanyo Electric Co., Ltd., Moriguchi, Japan

[21] Appl. No.: 752,679

[22] PCT Filed: Jan. 28, 1990

[86] PCT No.: PCT/JP91/00091
 § 371 Date: Sep. 3, 1991
 § 102(e) Date: Sep. 3, 1991

[87] PCT Pub. No.: WO91/11803
 PCT Pub. Date: Aug. 8, 1991

[30] Foreign Application Priority Data

Jan. 29, 1990 [JP] Japan ................................. 2-18634

[51] Int. Cl.$^5$ ............................................... H03F 1/34
[52] U.S. Cl. ..................................... 330/294; 330/85; 330/107; 360/67
[58] Field of Search ................. 330/85, 107, 109, 259, 330/260, 294; 360/67

[56] References Cited

U.S. PATENT DOCUMENTS 4,518,925  5/1985  Fukasawa ........................ 360/67 X Primary Examiner—James B. Mullins
Attorney, Agent, or Firm—Morrison Law Firm

[57] ABSTRACT

A head amplifier is integrated into an IC with a minimum number of pins and outside parts as well. An offset cancellation circuit cancels offset voltages to prevent distortion of playback signals. An amplifier amplifies a playback signal to produce an output signal that is fed to one input of a differential amplifier. A reference voltage is fed to the second input of the differential amplifier. The input of the differential amplifier is compared in a comparator with the reference voltage to produce a feedback signal for cancelling offset voltages. The feedback path is frequency sensitive to reduce frequency response at low frequencies, and to compensate for distortions produced at high frequencies from using PNP transistors in the comparator.

7 Claims, 2 Drawing Sheets

HEAD AMPLIFIER

BACKGROUND OF THE INVENTION

The present invention relates to a head amplifier for use with a home VTR, more specifically, to a head amplifier suitable for integratin into an IC.

A head amplifier is an amplifier for a home VTR which processes playback signals from a magnetic head. A head amplifier installed in an IC is disclosed, for example, in Japanese Laid-Open Publication No. 55-153108. The head amplifier of this publication has several disadvantages which will be detailed hereinbelow.

OBJECTS AND SUMMARY OF THE INVENTION

It is an object of the present invention to provide a head amplifier which overcomes the drawbacks of the prior art.

It is a further object of the invention to provide a head amplifier which includes a frequency-sensitive negative feedback path to permit use of PNP transistors, without the normal phase degradation resulting from such components.

It is a still further object of the invention to provide a head amplifier that uses a frequency-sensitive differential amplifier to cancel DC voltage offsets, and to maintain relatively constant response over an effective frequency band. The AC response rolls off at low frequencies to suppress unwanted low frequency noise.

Briefly stated, the present invention provides a head amplifier that is integrated into an IC with a minimum number of pins and outside parts as well. An offset cancellation circuit cancels offset voltages to prevent distortion of playback signals. An amplifier amplifies a playback signal to produce an output signal that is fed to one input of a differential amplifier. A reference voltage is fed to the second input of the differential amplifier. The input of the differential amplifier is compared in a comparator with the reference voltage to produce a feedback signal for cancelling offset voltages. The feedback path is frequency sensitive to reduce frequency response at low frequencies, and to compensate for distortions produced at high frequencies from using PNP transistors in the comparator.

According to an embodiment of the invention, there is provided a head amplifier comprising: an amplifier effective for producing an output in response to a playback signal from a head, a differential amplifier, means for feeding the output to the differential amplifier, means for producing a reference voltage, means for feeding the reference voltage to the differential amplifier, comparator for comparing the output with the reference voltage, and means for feeding back an output of the comparator to an input of the amplifier.

According to a feature of the invention, there is provided a head amplifier comprising: an amplifier for amplifying a playback signal from a head to produce an output signal, a differential amplifier responsive to a difference between the output signal and a reference voltage to produce an amplified output signal, a feedback circuit, means in the feedback circuit for comparing the amplified output signal with the reference voltage and feeding back a feedback signal to the amplifier, and means in the feedback circuit for amplifying the feedback signal with a high gain when a frequency of the amplified output signal is lower than an effective frequency band and amplifying the feedback signal with a smaller gain than the high gain when the frequency of the amplified output signal is higher than the effective frequency band.

The present invention comprises an amplifier which receives a playback signal from a head, a differential amplifier which amplifies the output of the amplifier, a comparator which compares the output of the amplifier with the reference voltage, and a feedback means which returns the output of the comparator. An offset between the two inputs to the differential amplifier is forced to zero by the output of the comparator being feed back to the amplifier.

The present invention also has a means creating a frequency characteristic in a feedback path; this means includes the comparator and the feedback means. This eliminates noise in the playback signal.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 2:
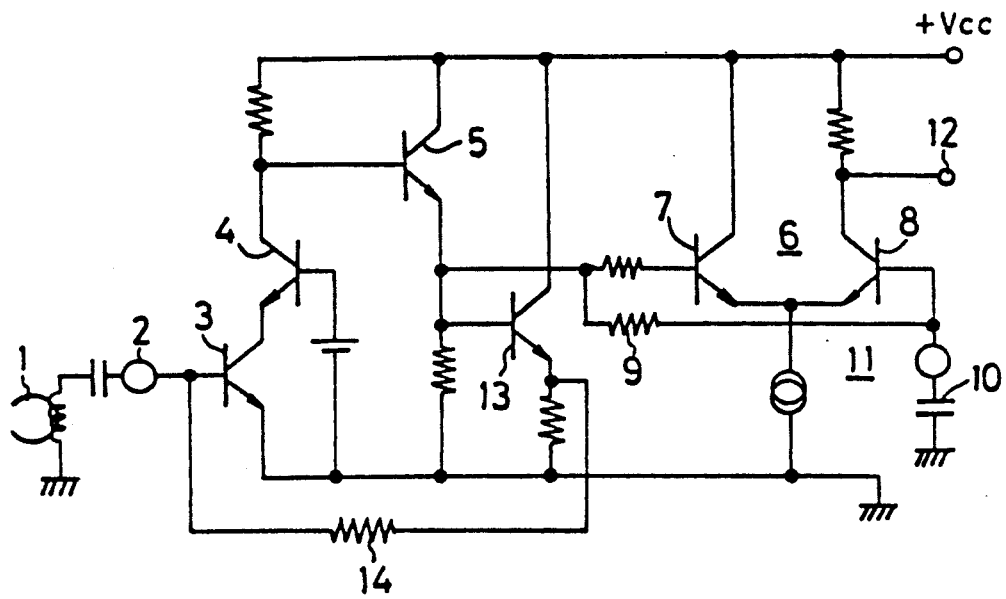
FIG. 2 is a schematic diagram of a head amplifier of the prior art.

Referring now to FIG. 2, a prior-art head amplifier, such as disclosed in Japanese Laid-Open Publication No. 55-153108, operates as follows: a playback signal from a video head 1 is sent through an input pin 2 to the base of a grounded-emitter transistor 3 installed in an ic. The signal is amplified in transistor 3, and fed to the emitter of a grounded-base transistor 4 which has its emitter-collector path connected in series with the emitter-collector path of grounded-emitter transistor 3. The amplified playback signal, appearing at the collector of transistor 3, is applied through a first buffer transistor 5 to the bases of a transistor 7 and a transistor 8 which form a differential amplifier 6. Signal components of the output playback signal from first buffer transistor are smoothed by a smoothing circuit 11 comprising a resistor 9 and capacitor 10. An output DC voltage of smoothing circuit 11 is applied to the base of transistor 8. The signal at the base of transistor 7 is amplified by differential amplifier 6 and the resulting amplified playback signal is output at terminal 12.

The playback signal produced by first buffer transistor 5 is returned to the base of grounded-emitter transistor 3 through a second buffer transistor 13 and feedback resistor 14. This forms a negative feedback loop which restores the AC and DC components of the amplified signal to their original states. The input impedance at the base of grounded-emitter transistor 3 is thus held constant to maintain a flat frequency characteristic of the circuit.

A major problem of this circuit, however, is that a capacitor 10 of smoothing circuit 11 is external to the IC, thereby creating a need for an increased number of pins on the IC. The difficulty becomes apparent when the head amplifier of FIG. 2 is used in conjunction with a four-head VTR. Four such circuits are required, thus creating a need for four external capacitors and several sets of extra pins.

A second problem of this circuit is the need for smoothing circuit 11. In the circuit of FIG. 2, emitter voltage of first buffer transistor 5 is determined by the $V_{BE}$ (base-emitter voltage) of grounded-emitter transistor 3, the voltage drop of feedback resistor 14, and the $V_{BE}$ of second buffer transistor 13. $V_{BE}$ varies from IC to IC, however, as the precision of the IC production process is limited. The emitter voltages of first buffer transistor 5 thus may vary from IC to IC, and the bias voltage of transistor 8 must be adjusted by smoothing circuit 11 to follow the variation. If the bias voltage applied to the base of transistor 8 is fixed, fluctuation of the emitter voltage of first buffer transistor 5 causes an offset voltage in differential amplifier 6, thus resulting in distortion of a weak playback signal.

A third problem of this circuit is that it does not filter out unwanted signals in the playback signal. An example of such an unwanted signal is leakage of RF switching pulses (30 Hz), which arise from switching the rotating heads of an accompanying VTR (not shown).

Figure 1:
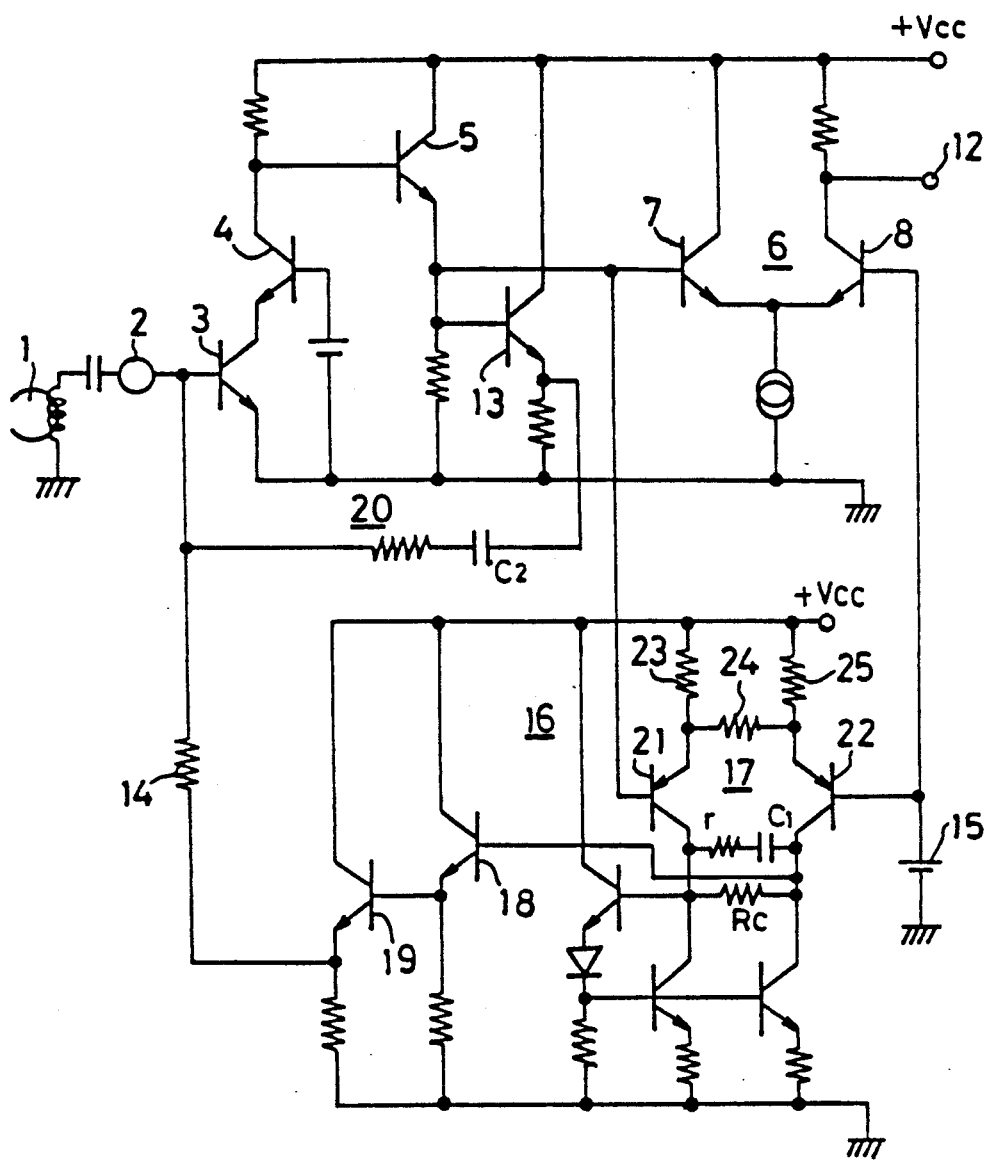
FIG. 1 is a schematic diagram of a head amplifier according to an embodiment of the invention.

Referring now to FIG. 1, a head amplifier according to the present invention includes a DC power source 15, represented by a battery symbol, connected to a base of a transistor 22 in a feedback circuit 16. Feedback circuit 16 compares an output of a first buffer transistor 5 with the voltage of power source 15. A high-pass filter 20 connects high-frequency components of an output signal from a second buffer transistor 13 to the base of a grounded-emitter transistor 3. Feedback circuit 16 contains a differential amplifier 17, the output level of which varies according to the frequency of an output signal from first buffer transistor 5, third buffer transistor 18, and fourth buffer transistor 19.

If no signal is applied to the amplifier, the circuit forms a negative feedback loop which maintains the emitter voltage of first buffer transistor 5 at the reference voltage produced by power source 15. The emitter voltage of first buffer transistor 5 (which is equivalent to the base voltage of a transistor 7) is compared with the reference voltage from power source 15 by a transistor 21 and a transistor 22 of differential amplifier 17. If the voltage at the base of transistor 21 exceeds the voltage at the base of transistor 22, the collector voltage of transistor 22 increases. As a consequence, increased voltage is fed through third buffer transistor 18 and fourth buffer transistor 19 to increase the emitter voltage of fourth buffer transistor 19. The base voltage of grounded-emitter transistor 3 is increased by the rise in voltage at the emitter of fourth buffer transistor 19. This increases the current in grounded-emitter transistor 3, as well as in grounded-base transistor 4. The resulting increase in current through the collector resistor of grounded-base transistor 4, reduces the voltage at the collector of grounded-base transistor 4. This, in turn, reduces the voltage at the base and the emitter of first buffer transistor 5. Eventually, the emitter voltage of first buffer transistor 5 is reduced to a value equal to the reference voltage of power source 15. Since the reference voltage of power source 15 is also applied to the base of a transistor 8, the DC base voltage levels of transistor 7 and 8 are always equal. Hence, DC offset voltage is zero and a differential amplifier 6 amplifies alternating-current signal from first buffer transistor 5 without distortion.

A combined resistance $R_E$, made up of resistors 23, 24, and 25 on the emitter side of differential amplifier 17, has a smaller resistance than that of a resistor $R_C$, which is located on the collector side. Combined resistance $R_E$ has the same resistance as a resistor r, which is found in series with a capacitor $C_1$ on the collector side of differential amplifier 17. Capacitor $C_1$ has a capacitance of about 50 pF, which is small enough to be installed in an IC, or to be manufactured as an integral part of an IC.

Figure 3:
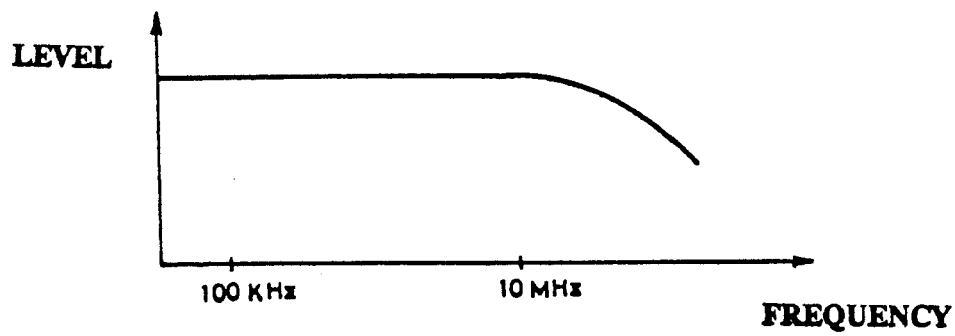
FIG. 3 is a curve representing the frequency characteristics of the circuit of FIG. 2.

An effective frequency band of a video playback signal falls between 100 KHz and 10 MHz as shown in FIG. 3. The level of the playback signal must be held constant within this frequency band. In the present invention, the playback signal is regenerated with a constant gain over the frequency range 100 KHz through 10 MHz, but is regenerated with a smaller gain at frequencies lower than 100 KHz. This prevents regeneration of unwanted signals.

Figure 4:
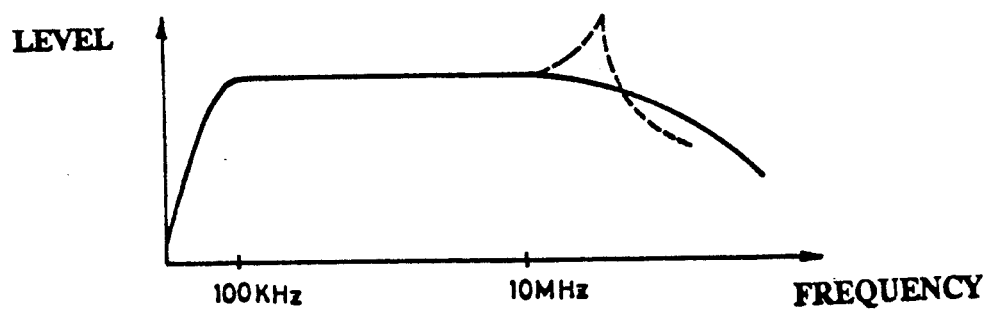
FIG. 4 is a curve representing the frequency characteristics of the circuit of FIG. 1.

Referring again to FIG. 1, when a playback signal with a frequency under 100 KHz is applied to an input pin 2, the playback signal is compared with the reference voltage of power source 15. The gain of differential amplifier 17 is determined by the ratio $R_C/R_E$. At frequencies in this vicinity, the gain of differential amplifier 17 is quite large. A signal having the same frequency of the playback signal, but with a large amplitude, is generated at the collector of transistor 22 and output to the emitter of fourth buffer transistor 19. Although feedback resistor 14 in FIG. 1 is equivalent to feedback resistor 14 in FIG. 2, the amplified feedback signal generated at the emitter of fourth buffer transistor 19 feeds back a large amount of negative feedback to the base of grounded-emitter transistor 3. This results in an input impedance at the base of grounded-emitter transistor 3 that is smaller than that in the head amplifier of FIG. 2. As the input impedance is reduced with decreasing frequency, the level of the playback signal also decreases as shown in FIG. 4. Since high-pass filter 20 blocks low-frequency signals, the function of the circuit is not affected by signals fed back through high-pass filter 20 in the low frequency range.

When the frequency of the playback signal begins to increase, the gain of differential amplifier 17 starts declining since the serial combination of resistor r and capacitor $C_1$ approaches the resistance of resistance $R_C$ on the collector side of differential amplifier 17. As a result, the level of feedback signal applied to the base of grounded-emitter transistor 3 is thereby reduced, thereby causing an increase in the input impedance of grounded-emitter transistor 3 and an increase in the level of playback signal as shown in FIG. 4.

At higher frequencies between 100 KHz and 10 MHz, the impedance of capacitor $C_1$ is very small compared to the resistance of resistor r. As a consequence, in this effective frequency band, the impedance of transistor 21 and transistor 22 on the collector side is determined only by resistor r. The gain of differential amplifier 17 becomes 1 and the level of the playback signal remains unchanged at the emitter of fourth buffer transistor 19. Since feedback resistor 14 in FIG. 1 is equivalent to feedback resistor 14 in FIG. 2, the circuit in FIG. 1 functions in the same way as the circuit in FIG. 2. That is, the input impedance of grounded-emitter transistor 3 remains constant. While the input impedance remains constant, the level of playback signal also remains constant as shown in FIG. 4. The signal does not alter the output DC voltage of first buffer transistor.

High-pass filter 20 is given a high cut-off frequency by selecting low capacitance capacitor $C_2$ of 50 to 60 pF. Thus, very few playback signals, within the effective frequency band, can pass high-pass filter 20. Consequently, the circuit in FIG. 1 is able to amplify the playback signal within the effective band without requiring an outside capacitor.

Referring to FIG. 4, playback signals with frequencies under the effective band are reduced to eliminate unwanted signals (such as 30 Hz PG pulses for a servo circuit) occurring below the effective frequency band.

Differential amplifier 17 in the present invention uses PNP transistors. These transistors, however, often exhibit insufficient frequency response over some higher frequency ranges, thus inducing phase distortion. This may cause affect a frequency-related distortion in the playback signal level, which can distort the negative feedback. This result is illustrated by a dotted line in FIG. 4 In the present invention, this disadvantage is compensated for by high-pass filter 20. When the frequency of the playback signal exceeds a certain limit, feedback is routed through the alternate path of high-pass filter 20, thereby maintaining the input impedance of grounded-emitter transistor 3, even though PNP transistors are used in feedback circuit 16.

The head amplifier of the present invention requires fewer outside parts and pins, and therefore is very useful for installation in an IC.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A head amplifier comprising:
an amplifier effective for producing an output in response to a playback signal from a head;
a differential amplifier;
means for feeding said output to said differential amplifier;
means for producing a reference voltage;
means for connecting said reference voltage to said differential amplifier;
means for comparing said output with said reference voltage; and
means for feeding back an output of said means for comparing to an input of said amplifier.

2. The head amplifier of claim 1, wherein said means for comparing includes means for modifying a frequency characteristic of said output of said amplifier, whereby a frequency characteristic of said head amplifier is modified.

3. The head amplifier of claim 2, wherein:
said means for modifying includes a high-pass filter; and
said high-pass filter has a low-frequency cutoff effective for preventing head-switching noise from being fed back to said amplifier.

4. The head amplifier of claim 1, wherein:
said comparator includes first and second transistors forming a second differential amplifier;
a series circuit of a capacitor and a resistor between respective collectors of said first and second transistors; and
said capacitor having a value capable of being formed on a substrate of an integrated circuit.

5. The head amplifier of claim 4, wherein said capacitor and said resistor have a time constant effective for reducing a gain of said head amplifier at frequencies below a predetermined value.

6. The head amplifier of claim 1 comprising:
a high-pass filter receiving said output; and
said high-pass filter having values effective to compensate a high frequency characteristic of said head amplifier.

7. A head amplifier comprising:
an amplifier for amplifying a playback signal from a head to produce an output signal;
a differential amplifier responsive to a difference between said output signal and a reference voltage to produce an amplified output signal;
a feedback circuit;
means in said feedback circuit for comparing said output signal with said reference voltage and feeding back a feedback signal to said amplifier; and
means in said feedback circuit for amplifying said feedback signal with a high gain when a frequency of said output signal is lower than an effective frequency band and amplifying said feedback signal with a smaller gain than said high gain when the frequency of said output signal is higher than said effective frequency band.

* * * * *